(12) United States Patent
Muthinti et al.

(10) Patent No.: US 11,295,969 B2
(45) Date of Patent: Apr. 5, 2022

(54) HYBRIDIZATION FOR CHARACTERIZATION AND METROLOGY

(71) Applicant: International Business Machines Corporation, Armonk, NY (US)

(72) Inventors: Gangadhara Raja Muthinti, Albany, NY (US); Matthew Sendelbach, Albany, NY (US); Roy Koret, Albany, NY (US); Aron Cepler, Albany, NY (US); Wei Ti Lee, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 774 days.

(21) Appl. No.: 16/200,764

(22) Filed: Nov. 27, 2018

(65) Prior Publication Data

US 2020/0168489 A1    May 28, 2020

(51) Int. Cl.
*H01L 21/67* (2006.01)
*G01B 15/02* (2006.01)
*G01B 11/06* (2006.01)

(52) U.S. Cl.
CPC ........ *H01L 21/67253* (2013.01); *G01B 11/06* (2013.01); *G01B 15/02* (2013.01); *G01B 2210/56* (2013.01)

(58) Field of Classification Search
CPC .............................................. H01L 21/67253
USPC ...................................................... 302/172
See application file for complete search history.

(56) References Cited

U.S. PATENT DOCUMENTS

| 4,511,800 | A | 4/1985 | Harbeke et al. |
| 5,034,611 | A | 7/1991 | Alpern et al. |
| 5,838,445 | A | 11/1998 | Sandhu et al. |
| 8,024,675 | B1 | 9/2011 | Gupta et al. |
| 8,050,900 | B2 | 11/2011 | Mitrovic et al. |
| 8,791,951 | B2 | 7/2014 | Lee et al. |
| 9,535,018 | B2 | 1/2017 | Peterlinz et al. |
| 9,952,166 | B2 | 4/2018 | Pois et al. |
| 2011/0148898 | A1 | 6/2011 | Lee |
| 2013/0203188 | A1 | 8/2013 | Vaid et al. |
| 2014/0170826 | A1* | 6/2014 | Clifton ................ H01L 29/7849 438/299 |

(Continued)

FOREIGN PATENT DOCUMENTS

WO    2017/79322 A1    5/2017

OTHER PUBLICATIONS

Dell'Olio et al.; "Recent advances in miniaturized optical gyroscopes"; Journal of European Soc. Rap. Public, vol. 9 (2014); 14 pages.

(Continued)

*Primary Examiner* — Tarifur R Chowdhury
*Assistant Examiner* — Omar H Nixon
(74) *Attorney, Agent, or Firm* — Cantor Colburn LLP

(57) ABSTRACT

A computer-implemented method for measuring a parameter of a semiconductor. A non-limiting example of the computer-implemented method includes receiving, using a processor, a raw signal from a first tool representing a measured parameter of a semiconductor device. The method also receives, using the processor, data on the measured parameter from a second tool, and calculates, using the processor, the measured parameter based on the data received from the second tool and on a constraint based on the raw signal from the first tool.

17 Claims, 8 Drawing Sheets

(56) References Cited

U.S. PATENT DOCUMENTS

| | | |
|---|---|---|
| 2015/0032398 A1 | 1/2015 | Peterlinz et al. |
| 2016/0141193 A1 | 5/2016 | Pandev et al. |
| 2016/0171748 A1 | 6/2016 | Kohlbrenner et al. |
| 2017/0176357 A1 | 6/2017 | Pois et al. |
| 2018/0090450 A1* | 3/2018 | Ito .................. H01L 29/161 |
| 2018/0112968 A1 | 4/2018 | Chen et al. |
| 2020/0111696 A1* | 4/2020 | Pape .................. H01L 21/681 |

OTHER PUBLICATIONS

Fauquier et al.; "Benefits of XPS nanocharacterization for process development and industrial control of thin SiGe channel layers in advanced CMOS technologies"; Materials Science in Semiconductor Processing 70 (2017); 6 pages.

Godny et al.; "Hybrid Approach to Optical CD Metrology of Directed Self-Assembly Lithography"; Metrology, Inspection, and Process Control for Microlithography XXVII (2013); 8 pages.

Vaid et al.; "Hybrid enabled thim film metrology using XPS and optical"; SPIEDigitalLibrary.org/conference-proceedings-of-spie (2016); 12 pages.

* cited by examiner

HYBRIDIZATION FOR CHARACTERIZATION AND METROLOGY

BACKGROUND

The present invention generally relates to measurement of semiconductors and more specifically, to a hybridization method for characterization and metrology.

In the development of nanosheet and nanowire technology there is a need to measure the thickness of each layer, the concentration of Germanium in Silicon Germanium layers, strain in Silicon and Silicon Germanium layers, and dielectric properties of Nitride layers. Usually a single metrology technique is not sufficient. Accurate and high throughput during measurement is desired to increase yield.

SUMMARY

Embodiments of the present invention are directed to a computer-implemented method for measuring a parameter of a semiconductor. A non-limiting example of the computer-implemented method includes receiving, using a processor, a raw signal from a first tool representing a measured parameter of a semiconductor device. The method also receives, using the processor, data on the measured parameter from a second tool, and calculates, using the processor, the measured parameter based on the data received from the second tool and on a constraint based on the raw signal from the first tool.

Embodiments of the present invention are directed to a system measuring a parameter of a semiconductor. A non-limiting example of the system includes a memory and a processor communicatively coupled to the memory. The processor is operable to execute instructions stored in the memory. The instructions cause the processor to receive a raw signal from a first tool representing a measured parameter of a semiconductor device. The processor also receives data on the measured parameter from a second tool, and calculates the measured parameter based on the data received from the second tool and on a constraint based on the raw signal from the first tool.

Embodiments of the invention are directed to a computer program product for measuring a parameter of a semiconductor device, the computer program product including a computer readable storage medium having program instructions embodied therewith. The program instructions are executable by a processor to cause the processor to perform a method. A non-limiting example of the method includes receiving, using the processor, a raw signal from a first tool representing a measured parameter of a semiconductor device. The method also receives, using the processor, data on the measured parameter from a second tool, and calculates, using the processor, the measured parameter based on the data received from the second tool and on a constraint based on the raw signal from the first tool.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 7 illustrates the goodness of fit of a measured parameter according to an embodiment of the present invention.

Figure 1:
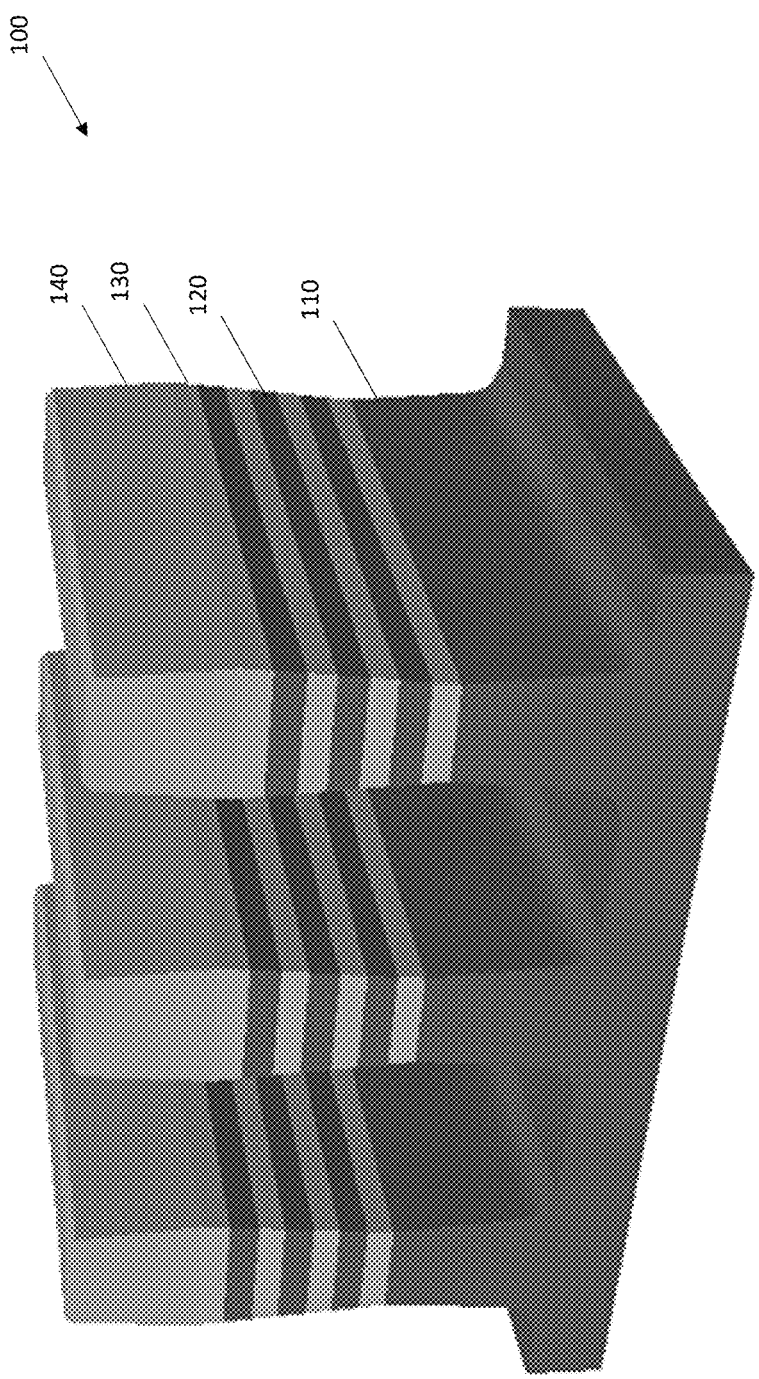
FIG. 1 illustrates an exemplary semiconductor structure upon which measurements can be conducted according to an embodiment of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" can include any integer number greater than or equal to one, i.e. one, two, three, four, etc. The terms "a plurality" can include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, in scatterometry, light is shined on a wafer and the light scatter returned from the wafer is measured and a scatter signature analyzed and modeled. As a model based technique, its accuracy is based on the input to the model, the model properties or refractive index. Results can be generated by library search techniques or optimization techniques. In library search techniques a pre-generated library of theoretically modeled reference signatures across a relevant range of variables is used. This library is searched for a match against a measured signal. The best match is reported back as the measurement. In optimization techniques, multiple algorithms are employed and requires a starting point or a range to search. The algorithms are run to converge on a best solution which is reported as the result.

These basic techniques can be used in a hybridization technique that uses multiple measurement tools, where the output of a first tool can be used as the input to a second tool. However, this basic technique has an issue with correlation that can generate poor results.

Turning now to an overview of the aspects of the invention, one or more embodiments of the invention address the above-described shortcomings of the prior art by providing a hybridization technique that uses the raw signal from a first tool as a constraint or boundary condition on a second tool.

The above-described aspects of the invention address the shortcomings of the prior art by using a raw signal from a first tool, instead of its output, as a source of a parameter A that is being measured by a first and second tool as an input to a second tool as a constraint or boundary condition, the output of the second tool's measurement is improved. This is referred to as an equation-based hybridization ("EBC") technique. As opposed to previously described hybridization schemes, where the calculated values from one tool are used with a different tool to solve for the best value, here the invention uses raw signal data from the first tool, such as an x-ray tool, as constraints for the second tool which uses optical scatterometry metrology. Unlike traditional hybrid metrology, the EBC technique provides accuracy without sacrificing throughput or cycle time. It is also applicable to a wide variety of applications across modules and complexity in next generation device architectures because such architectures have a large number of critical parameters.

The basic equation used is:

$$I_{GeL\alpha} = f(t_{SiGe}{}^n, t_{Si}{}^n, x_{Ge\%}{}^n)$$

where $I_{GeL\alpha}$ is the count associated with a Germanium L alpha signal, in other words, the total number of Germanium atoms detected over the course of the signal collection period, t is thickness, x is concentration of Germanium, and n refers to the different layers in a nanosheet, for example.

This equation can be rewritten as:

$$I_{GeL\alpha} = A [f_{SiGe1} t_{SiGe1} = f_{SiGe2} t_{SiGe2} = f_{SiGe3} t_{SiGe3} = f_{SiGe4} t_{SiGe4}]$$

where A is a proportionality constant and f is the fraction of Germanium in a Silicon Germanium layer. The proportionality constant A can be calculated using a calibration set.

FIG. 1 illustrates an exemplary semiconductor structure upon which measurements can be conducted according to an embodiment of the present invention. In a semiconductor structure 100, a silicon substrate 110 is below alternating layers of Silicon 120 and Silicon Germanium 130. Above the last Silicon Germanium layer 130 is a nitride or Silicon nitride layer 140. It can be desired to measure the thickness of each layer, the concentration of Germanium, the strain in the Silicon layer 120 and the Silicon Germanium layer 130, and the dielectric properties of the Nitride layer 140, for example. These measurements are referred to as parameters.

Figure 2:
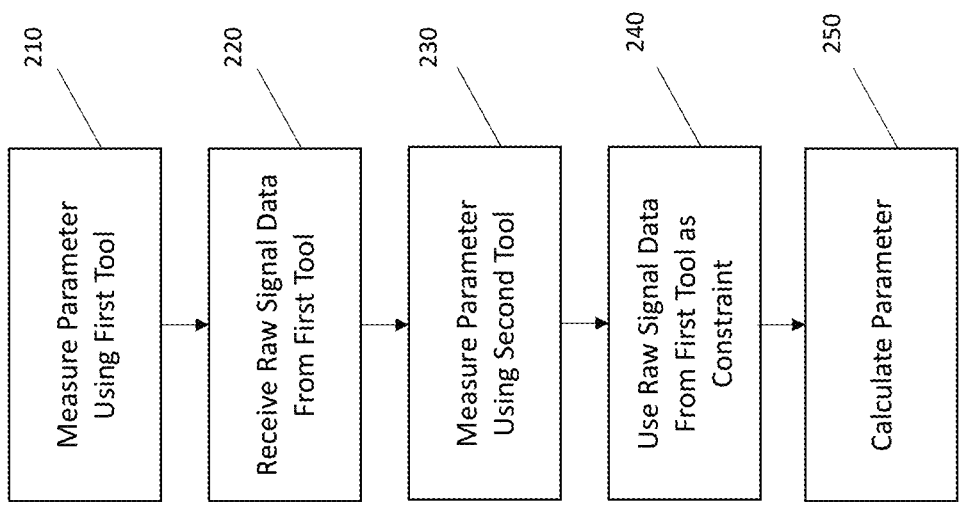
FIG. 2 illustrates a flowchart for measuring parameters using the equation-based hybridization technique according to an embodiment of the present invention.

FIG. 2 illustrates a flowchart for measuring parameters using the equation-based hybridization technique according to an embodiment of the present invention. A desired parameter, for example the thickness of a particular SiGe layer, is selected. Using a first tool, the first parameter is measured. (Stage 210). The first tool can be, for example, an X-ray tool. In standard hybridization techniques, the X-ray tool would analyze the raw signal data and return the result for parameter A which might then be used as an input to additional tools. In contrast, in the present invention, the raw signal data from the first tool is received (stage 220) for future use as an input to a second tool.

The parameter is also measured by a second tool. (Stage 230). The second tool can be, for example, an optical scatterometer. Although X-ray tools and scatterometry tools are discussed herein, those skilled in the art, after reading this detailed description, will appreciate that other tools can be used. The raw signal data from the first tool is used as a constraint on the results from the second tool (stage 240). Specifically, the equations described above act as a constraint or boundary condition for the second tool. The second tool calculates the result of the parameter using the constraints based on the raw data received from the first tool (stage 250). As described previously, the second tool can calculate the parameter by using a library search technique or an optimization technique along with the constraints imposed by the equation coupled with the raw data from the first tool.

FIGS. 3-6 illustrate graphs of various parameters measured on a 300 mm wafer using the equation-based hybridization technique described. Each graph includes six lines that represent six different polarizations of light.

Figure 3:
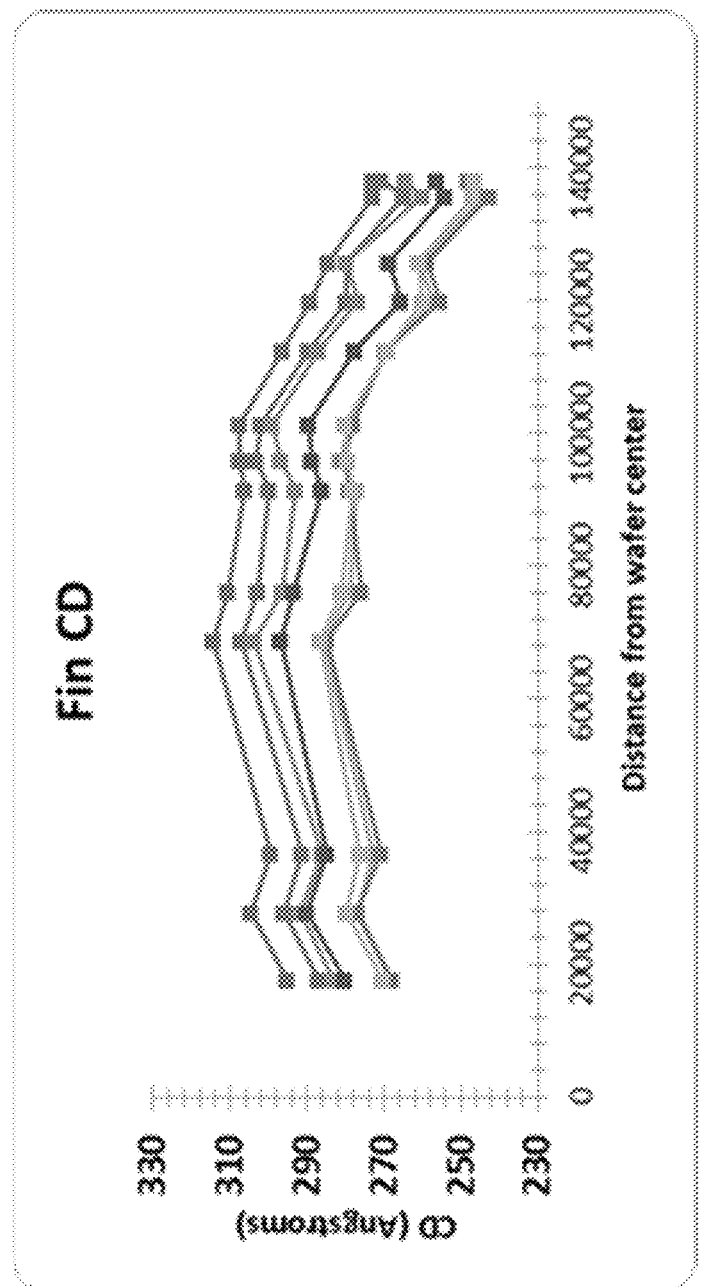
FIG. 3 illustrates an exemplary graph of Fin CD measured at six different polarizations of light according to an embodiment of the present invention

FIG. 3 illustrates an exemplary graph of Fin CD measured at six different polarizations of light according to an embodiment of the present invention. Fin CD is measured as the height of the lowest SiGe layer 130. The Y axis is a measurement of CD in Angstroms, and the X axis represents the CD along a distance from the center of a 300 mm wafer measured in microns.

Figure 4:
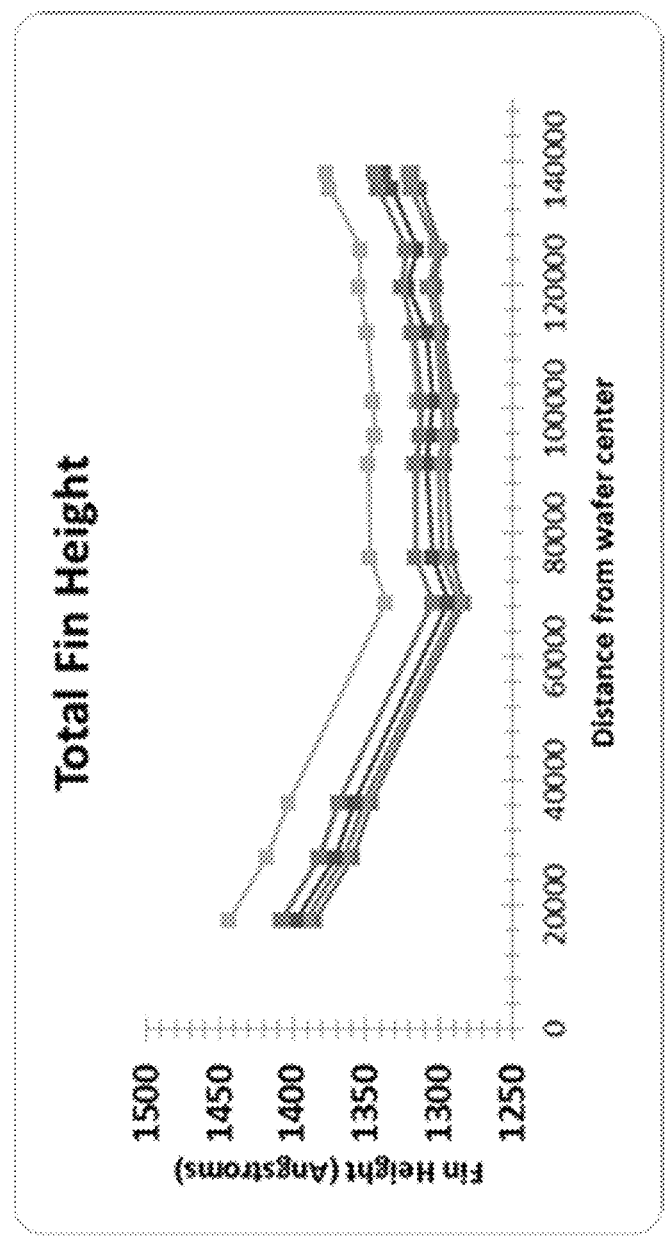
FIG. 4 illustrates an exemplary graph of Total Fin Height measured at six different polarizations of light according to an embodiment of the present invention.

FIG. 4 illustrates an exemplary graph of Total Fin Height measured at six different polarizations of light according to an embodiment of the present invention. Total Fin Height is the height from the bottom of the lowest SiGe layer 130 to the top of the uppermost SiGe layer 130. The Y axis is a measurement of CD in Angstroms, and the X axis represents the CD along a distance from the center of a 300 mm wafer measured in microns.

Figure 5:
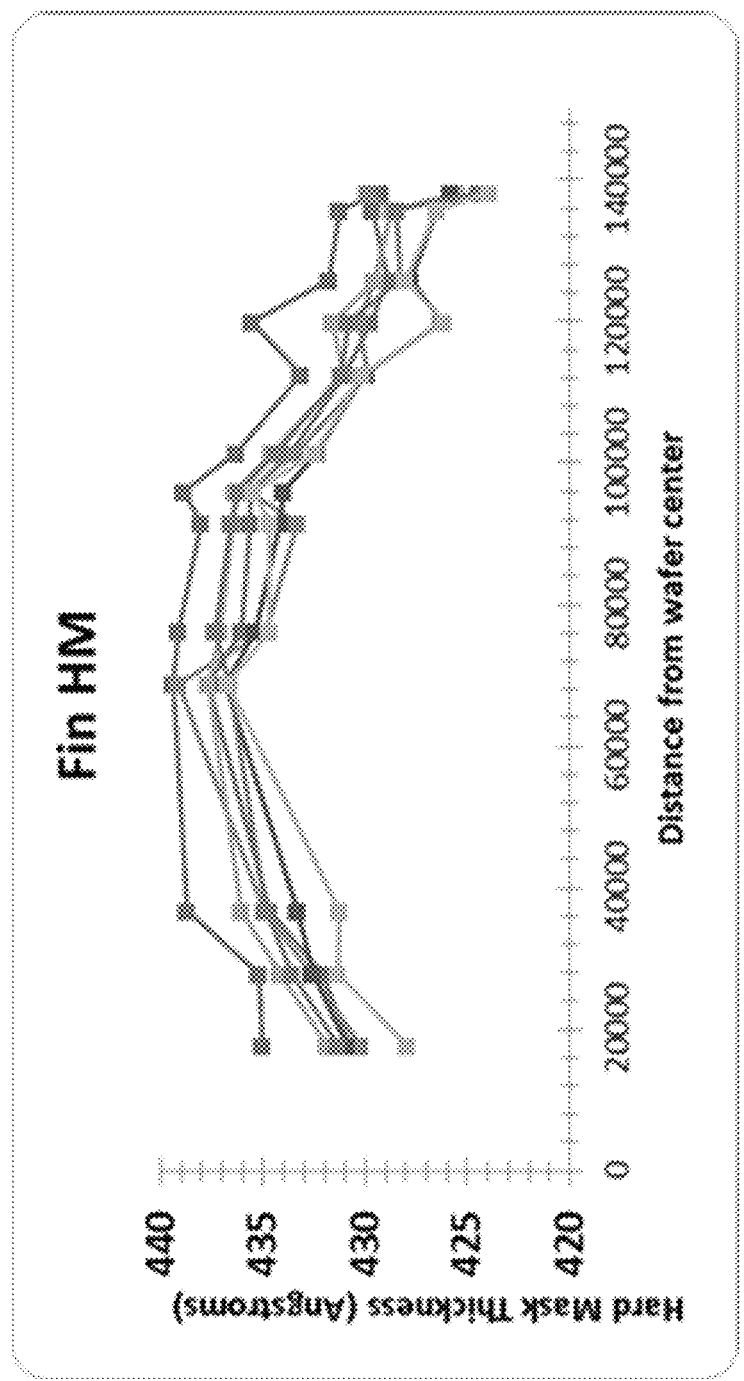
FIG. 5 illustrates an exemplary graph of Fin Hard Mask measured at six different polarizations of light according to an embodiment of the present invention.

FIG. 5 illustrates an exemplary graph of Fin Hard Mask measured at six different polarizations of light according to an embodiment of the present invention. Fin Hard Mask is the height of the Nitride layer 140. The Y axis is a measurement of CD in Angstroms, and the X axis represents the CD along a distance from the center of a 300 mm wafer measured in microns.

Figure 6:
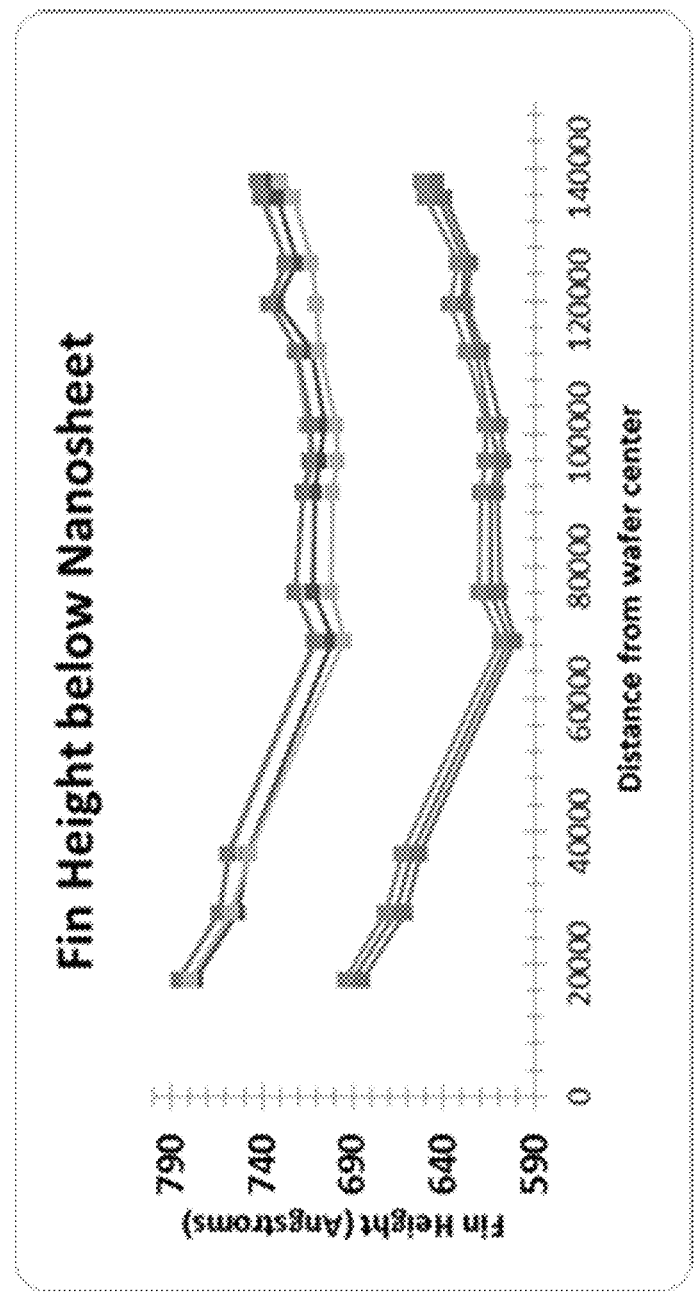
FIG. 6 illustrates an exemplary graph of Fin Height below Nanosheet measured at six different polarizations of light according to an embodiment of the present invention.

FIG. 6 illustrates an exemplary graph of Fin Height below Nanosheet measured at six different polarizations of light according to an embodiment of the present invention. Fin Height below Nanosheet is the height of the trench below the lowest SiGe layer 130. The Y axis is a measurement of CD in Angstroms, and the X axis represents the CD along a distance from the center of a 300 mm wafer measured in microns.

Figure 7:
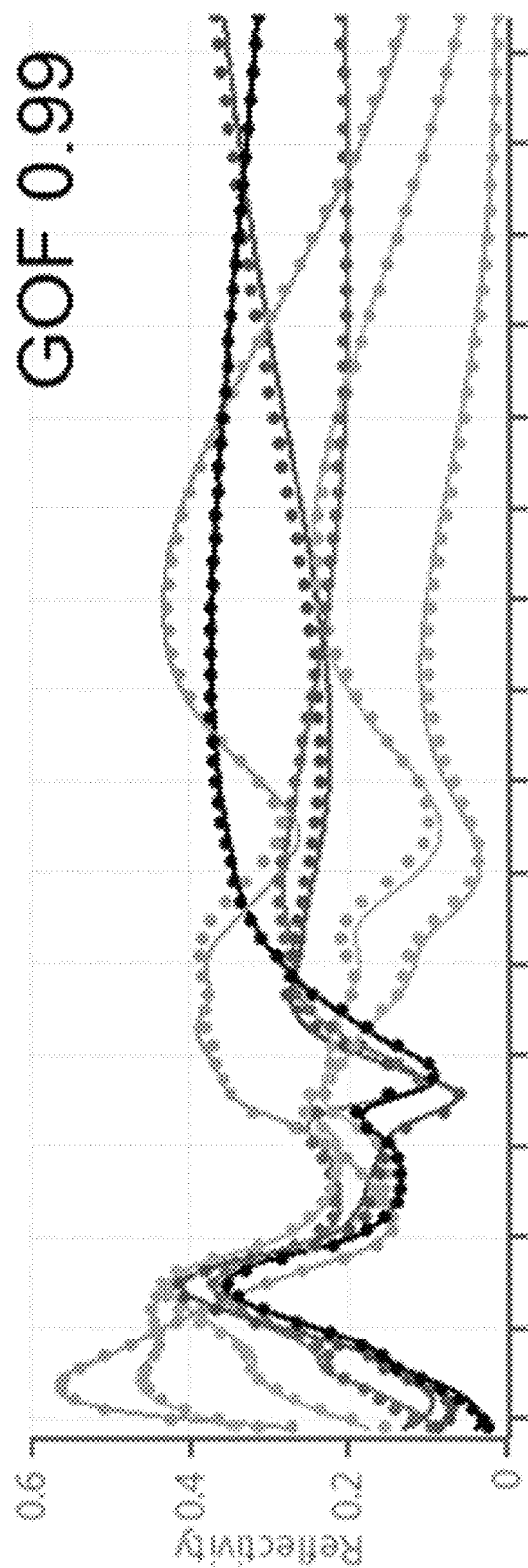
FIG. 7 depicts details of an exemplary computing system capable of implementing aspects of the invention.

FIG. 7 illustrates the goodness of fit of a measured parameter according to an embodiment of the present invention. The goodness of fit is an indication of how well the model used in the calculations matches the actual data. Each line is the theoretical model for the reflection of light for a different polarization of light. The input parameters are thickness in the x, y, and z directions of height of the layers and the properties of the materials measured, such as refractive index. The graph in the figure shows points which are the actual data calculated by the process. As can be seen, the points track the lines, as would be expected with a goodness of fit of 0.99. The model has been optimized to get the best possible goodness of fit.

Figure 8:
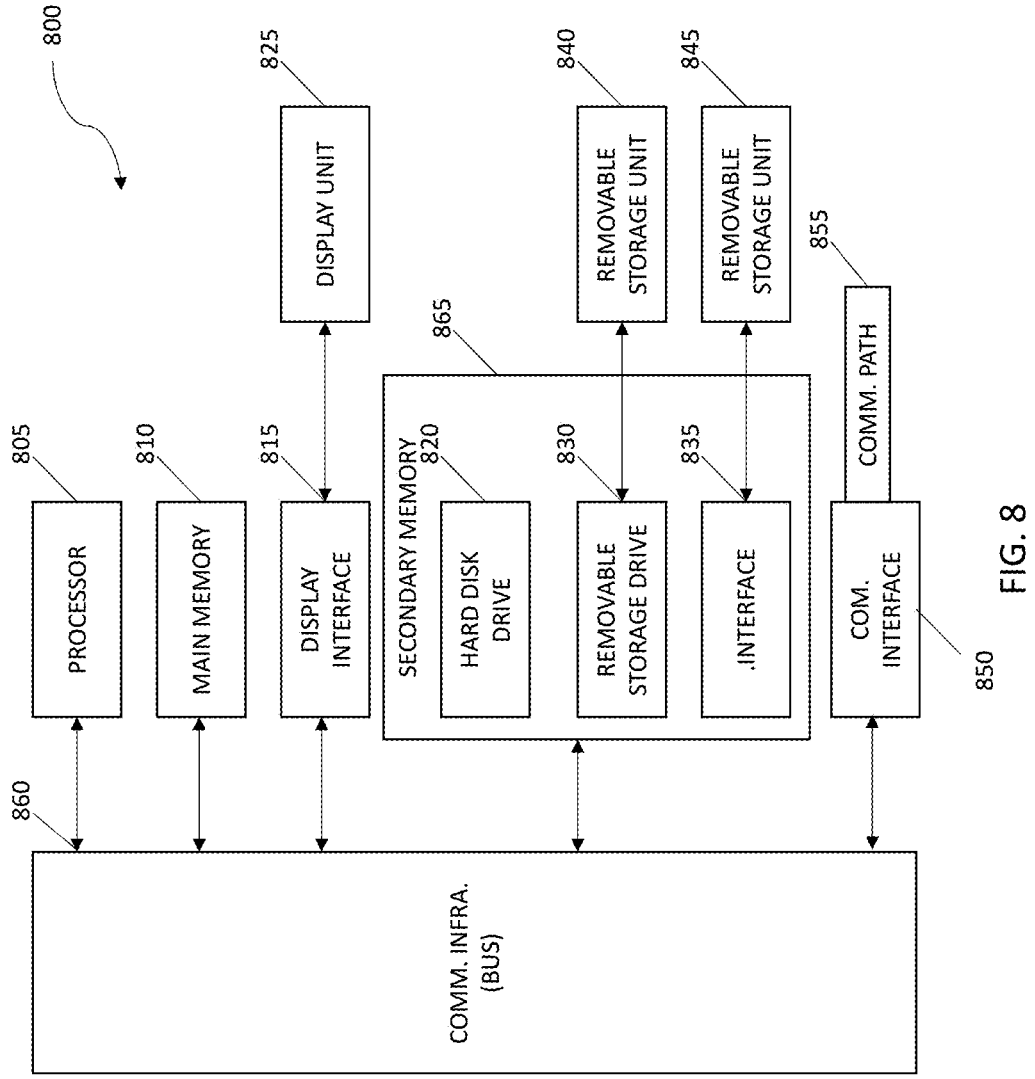
FIG. 8 depicts details of an exemplary computing system capable of implementing aspects of the invention.

FIG. 8 depicts details of an exemplary computing system capable of implementing aspects of the invention. FIG. 8 depicts a high level block diagram computer system 800, which can be used to implement one or more aspects of the present invention. More specifically, computer system 800 can be used to implement some hardware components of embodiments of the present invention. Although one exemplary computer system 800 is shown, computer system 800 includes a communication path 855, which connects computer system 800 to additional systems (not depicted) and can include one or more wide area networks (WANs) and/or local area networks (LANs) such as the Internet, intranet(s), and/or wireless communication network(s). Computer system 800 and additional system are in communication via communication path 855, e.g., to communicate data between them.

Computer system 800 includes one or more processors, such as processor 805. Processor 805 is connected to a communication infrastructure 860 (e.g., a communications bus, cross-over bar, or network). Computer system 800 can include a display interface 815 that forwards graphics, text, and other data from communication infrastructure 860 (or from a frame buffer not shown) for display on a display unit 825. Computer system 800 also includes a main memory 810, preferably random access memory (RAM), and can also include a secondary memory 865. Secondary memory 865 can include, for example, a hard disk drive 820 and/or a removable storage drive 830, representing, for example, a floppy disk drive, a magnetic tape drive, or an optical disk drive. Removable storage drive 830 reads from and/or writes to a removable storage unit 840 in a manner well known to those having ordinary skill in the art. Removable storage unit 840 represents, for example, a floppy disk, a compact disc, a magnetic tape, or an optical disk, etc. which is read by and written to by removable storage drive 830. As will be appreciated, removable storage unit 840 includes a computer readable medium having stored therein computer software and/or data.

In alternative embodiments, secondary memory 865 can include other similar means for allowing computer programs or other instructions to be loaded into the computer system. Such means can include, for example, a removable storage unit 845 and an interface 835. Examples of such means can include a program package and package interface (such as that found in video game devices), a removable memory chip (such as an EPROM, or PROM) and associated socket, and other removable storage units 845 and interfaces 835 which allow software and data to be transferred from the removable storage unit 845 to computer system 800.

Computer system 800 can also include a communications interface 850. Communications interface 850 allows software and data to be transferred between the computer system and external devices. Examples of communications interface 850 can include a modem, a network interface (such as an Ethernet card), a communications port, or a PCM-CIA slot and card, etcetera. Software and data transferred via communications interface 850 are in the form of signals which can be, for example, electronic, electromagnetic, optical, or other signals capable of being received by communications interface 850. These signals are provided to communications interface 850 via communication path (i.e., channel) 855. Communication path 855 carries signals and can be implemented using wire or cable, fiber optics, a phone line, a cellular phone link, an RF link, and/or other communications channels.

In the present description, the terms "computer program medium," "computer usable medium," and "computer readable medium" are used to generally refer to media such as main memory 810 and secondary memory 865, removable storage drive 830, and a hard disk installed in hard disk drive 820. Computer programs (also called computer control logic) are stored in main memory 810 and/or secondary memory 865. Computer programs can also be received via communications interface 850. Such computer programs, when run, enable the computer system to perform the features of the present invention as discussed herein. In particular, the computer programs, when run, enable processor 805 to perform the features of the computer system. Accordingly, such computer programs represent controllers of the computer system.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method comprising:
receiving, using a processor, a raw data from a first tool representing a measured parameter of a semiconductor device, the first tool comprising an X-ray tool;
providing, using the processor, the raw data as input to a second tool;
receiving, using the processor, data on the measured parameter from the second tool; and
determining, using the processor, the measured parameter based on the data received from the second tool and based on the input of the raw data from the first tool to the second tool as a constraint on the second tool, thereby determining the measured parameter of the semiconductor device.

2. The computer-implemented method of claim 1, wherein the second tool comprises an optical tool.

3. The computer-implemented method of claim 1, wherein the constraint based on the raw data from the first tool is determined based on a count associated with a Germanium L alpha signal, a thickness of a layer, a concentration of Germanium in the layer, where the layer is a nanosheet.

4. The computer-implemented method of claim 3, wherein the calculation of the parameter uses a library search technique.

5. The computer-implemented method of claim 3, wherein the calculation of the parameter uses an optimization technique.

6. The computer-implemented method of claim 3, wherein the second tool comprises an optical scatterometer.

7. A system comprising:
a memory; and
a processor communicatively coupled to the memory, the processor operable to execute instructions stored in the memory, the instructions causing the processor to:
receive a raw data from a first tool representing a measured parameter of a semiconductor device, the first tool comprising an X-ray tool;
provide the raw data as input to a second tool;
receive data on the measured parameter from the second tool; and
determine the measured parameter based on the data received from the second tool and based on the input of the raw data from the first tool to the second tool as a constraint on the second tool, thereby determining the measured parameter of the semiconductor device.

8. The system of claim 7, wherein the second tool comprises an optical tool.

9. The system of claim 7, wherein the constraint based on the raw data from the first tool is determined based on a count associated with a Germanium L alpha signal, a thickness of a layer, a concentration of Germanium in the layer, where the layer is a nanosheet.

10. The system of claim 9, wherein the calculation of the parameter uses a library search technique.

11. The system of claim 9, wherein the calculation of the parameter uses an optimization technique.

12. The system of claim 9, wherein the second tool comprises an optical scatterometer.

13. A computer program product for storing I/O statistics of a data set during initialization of a system, the computer program product comprising a computer readable storage medium having program instructions embodied therewith, the program instructions executable by a computer, to cause the computer to perform a method comprising:
receiving a raw data from a first tool representing a measured parameter of a semiconductor device, the first tool comprising an X-ray tool;
providing, using the processor, the raw data as input to a second tool;
receiving data on the measured parameter from the second tool; and
determining the measured parameter based on the data received from the second tool and based on the input of the raw data from the first tool to the second tool as a constraint on the second tool, thereby determining the measured parameter of the semiconductor device.

14. The computer program product of claim 13, wherein the constraint based on the raw data from the first tool is determined based on a count associated with a Germanium L alpha signal, a thickness of a layer, a concentration of Germanium in the layer, where the layer is a nanosheet.

15. The computer program product of claim 14, wherein the calculation of the parameter uses a library search technique.

16. The computer program product of claim 15, wherein the calculation of the parameter uses an optimization technique.

17. The computer program product of claim 14, wherein the second tool comprises an optical scatterometer.

* * * * *